(12) United States Patent
Bingeman et al.

(10) Patent No.: US 6,298,463 B1
(45) Date of Patent: Oct. 2, 2001

(54) PARALLEL CONCATENATED CONVOLUTIONAL CODING

(75) Inventors: Mark Bingeman, Waterloo; Amir Keyvan Khandani, Kitchener; Farideh Khaleghi, Ottawa, all of (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/126,993

(22) Filed: Jul. 31, 1998

(51) Int. Cl.[7] .......................... H03M 13/03; H03M 13/00
(52) U.S. Cl. ....................... 714/786; 714/755; 714/757
(58) Field of Search .................................. 714/755, 701, 714/757, 786, 787, 788

(56) References Cited

U.S. PATENT DOCUMENTS

| | | | |
|---|---|---|---|
| 4,559,625 | * 12/1985 | Berlekamp et al. | 714/701 |
| 5,721,745 | * 2/1998 | Hladik et al. | 714/755 |
| 5,983,384 | * 11/1999 | Ross | 714/755 |
| 5,996,104 | * 11/1999 | Herzberg | 714/755 |

OTHER PUBLICATIONS

A. Khandani, Group Structured of Turbo–codes with Application to the Interleaver Design, IEEE, Aug. 1998.*
"Near Shannon Limit Error–Correcting coding and Decoding: Turbo–Codes", C.Berrou et al., Proceedings of the IEEE International Conference on Communications, 1993, pp. 1064–1070.

* cited by examiner

*Primary Examiner*—Emmanuel L. Moise

(57) ABSTRACT

In a parallel concatenated convolutional code (PCCC) or turbo code encoder, information bits are supplied to a first convolutional code encoder for producing first parity bits and via an interleaver to a second convolutional code encoder for producing second parity bits, the output of the encoder comprising the information bits and at least some of the first and second parity bits. The interleaver interleaves the information bits in groups each of N bits, where N is an integer greater than one. A parity bit generator can generate additional parity bits which are operated on by the convolutional code encoders and interleaver. A complementary decoder is described. The grouped interleaving can provide reduced memory requirements and faster convergence of the iterative decoding process.

20 Claims, 3 Drawing Sheets

| 1 | n+1 | 2n+1 | • | • | (m-1)n+1 |
| --- | --- | --- | --- | --- | --- |
| 2 | n+2 | 2n+2 | • | • | (m-1)n+2 |
| 3 | n+3 | 2n+3 | • | • | (m-1)n+3 |
| 4 | n+4 | 2n+4 | • | • | (m-1)n+4 |
| • | • | • | | | • |
| • | • | • | | | • |
| n-1 | 2n-1 | 3n-1 | • | • | mn-1 |
| n | 2n | 3n | • | • | mn |

PARALLEL CONCATENATED CONVOLUTIONAL CODING

This invention relates to coding using parallel concatenated convolutional codes or PCCCs, also known as turbo codes. Such codes can be used in various communications systems, especially for CDMA (code division multiple access) communications which are increasingly being used in cellular wireless communications systems. The term coding is used herein to embrace methods and apparatus for both encoding and decoding, with or without modulation and demodulation of coded signals.

BACKGROUND

PCCCs or turbo codes are known for example from an article by C. Berrou et al. entitled "Near Shannon Limit Error-Correcting Coding And Decoding: Turbo-Codes", Proceedings of the IEEE International Conference on Communications, 1993, pages 1064–1070. That article showed that a turbo code together with an iterative decoding algorithm could provide performance in terms of BER (Bit Error Rate) that is close to the theoretical limit. A turbo code encoder provides a parallel concatenation of two (or more) RSC (Recursive Systematic Convolutional) codes which are typically, but not necessarily, identical, applied to an input bit sequence and an interleaved version of this input bit sequence. The output of the encoder comprises systematic bits (the input bit sequence itself) and parity bits which can be "punctured" (selected) to provide a desired rate of encoding.

Various schemes are being proposed and developed to provide, especially for the communication of data in a CDMA communications system, a greater bandwidth (signal transmission rate) than is provided in a so-called IS-95 system which is compatible with TIA/EIA (Telecommunications Industry Association/Electronic Industries Association) Interim Standard IS-95-A, "Mobile Station-Base Station Compatibility Standard for Dual-Mode Wideband Spread Spectrum Cellular System". Turbo coding has been proposed for such WCDMA (wideband CDMA) systems.

While coding using PCCCs or turbo codes can provide substantial advantages, there remains a need to provide an optimum coding for the best possible performance in respect of a variety of factors such as BER, spectral efficiency, and decoder complexity.

An object of this invention is to provide improved encoding and decoding methods and apparatus using PCCCs.

SUMMARY OF THE INVENTION

One aspect of this invention provides a parallel concatenated convolutional code (PCCC) encoder in which information bits are supplied to a first convolutional code encoder for producing first parity bits and via an interleaver to a second convolutional code encoder for producing second parity bits, wherein the interleaver interleaves the information bits in groups each of N bits, where N is an integer greater than one.

In preferred embodiments of the invention, N=2 or 3.

The encoder can also include a parity bit generator supplied with the information bits for generating additional parity bits, wherein the additional parity bits are supplied with the information bits to at least one of the first convolutional code encoder and the interleaver.

Another aspect of the invention provides a parallel concatenated convolutional code (PCCC) encoder comprising: a parity bit generator responsive to information bits supplied to an input of the encoder for generating parity bits; an interleaver responsive the information bits and the parity bits for interleaving the information and parity bits in groups each of N bits, where N is an integer greater than one; a first convolutional code encoder responsive to at least the information bits for producing first output parity bits; a second convolutional code encoder responsive to interleaved information and parity bits produced by the interleaver, to produce second output parity bits; and means for deriving an output of the PCCC encoder from the information bits and at least some of the first and second output parity bits.

Preferably the first convolutional code encoder is also responsive to the parity bits produced by the parity bit generator. In a particular form of the encoder, the parity bit generator generates one of said parity bits for every two information bits, and N=3.

A further aspect of the invention provides a method of encoding comprising the steps of supplying information bits directly as systematic bits, via a first convolutional code encoder to produce first parity bits, and via an interleaver and a second convolutional code encoder to produce second parity bits, to encoder outputs, wherein the interleaver interleaves the information bits in groups each of N bits, where N is an integer greater than one.

The invention also provides a parallel concatenated convolutional code (PCCC) decoder comprising two constituent decoders coupled together via at least one interleaver and at least one deinterleaver complementary to the interleaver for iteratively decoding systematic and parity information produced by a PCCC encoder, wherein the interleaver and deinterleaver operate to interleave and deinterleave information in groups each representing N bits, where N is an integer greater than one.

In addition, the invention provides a method of decoding information encoded by the method recited above, comprising iteratively decoding in first and second decoders information representing the systematic bits using information representing the first and second parity bits respectively and iterative decoding information coupled from the first decoder to the second decoder via an interleaver and from the second decoder to the first decoder via a deinterleaver complementary to the interleaver, wherein the interleaver interleaves the information in groups each representing N bits, where N is an integer greater than one.

BRIEF DESCRIPTION OF THE DRAWINGS

The invention will be further understood from the following description with reference to the accompanying drawings, in which.

DETAILED DESCRIPTION

Figure 1:
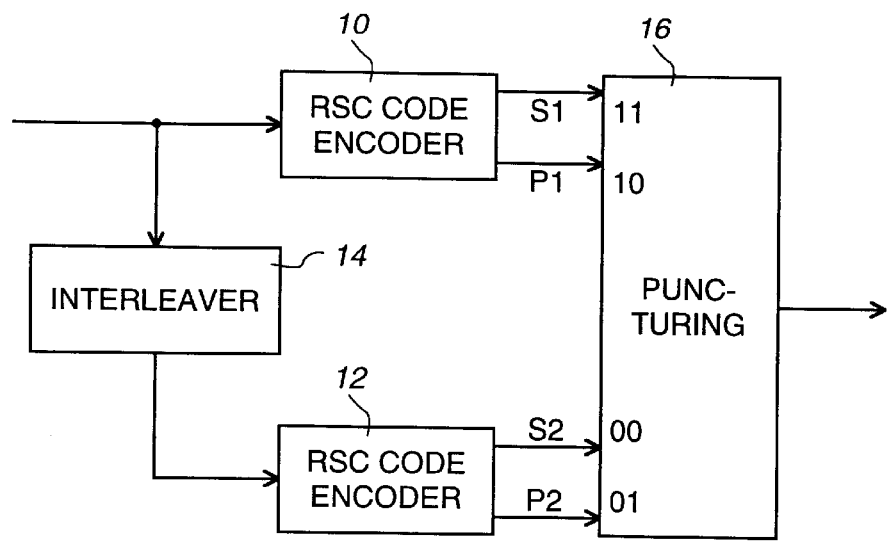
FIG. 1 illustrates a known PCCC or turbo code encoder.

Referring to FIG. 1, a known PCCC or turbo code encoder comprises two RSC code encoders 10 and 12 whose inputs are separated by an interleaver 14. The outputs of the encoders 10 and 12 are selected or punctured by a puncturing block or selector 16, the output of which constitutes an output of the encoder and for example can be supplied to a modulator (not shown) for producing modulated information for transmission.

The encoders 10 and 12 can be identical RSC code encoders, which may for example be rate ½ encoders as described below. Each of the encoders 10 and 12 produces at its outputs both systematic bits S, constituted directly by information bits supplied to the input of the encoder, and parity bits P which are produced by the encoding operation of the encoder. In the case of rate ½ encoders, for each information bit supplied to the input of the encoder 10 or 12 the encoder produces this information bit at its output as a systematic bit S1 or S2 respectively, and also produces by its encoding operation a parity bit P1 or P2 respectively, so that there are two output bits from each encoder for each input information bit supplied to the encoder (i.e. rate ½).

Figure 2:
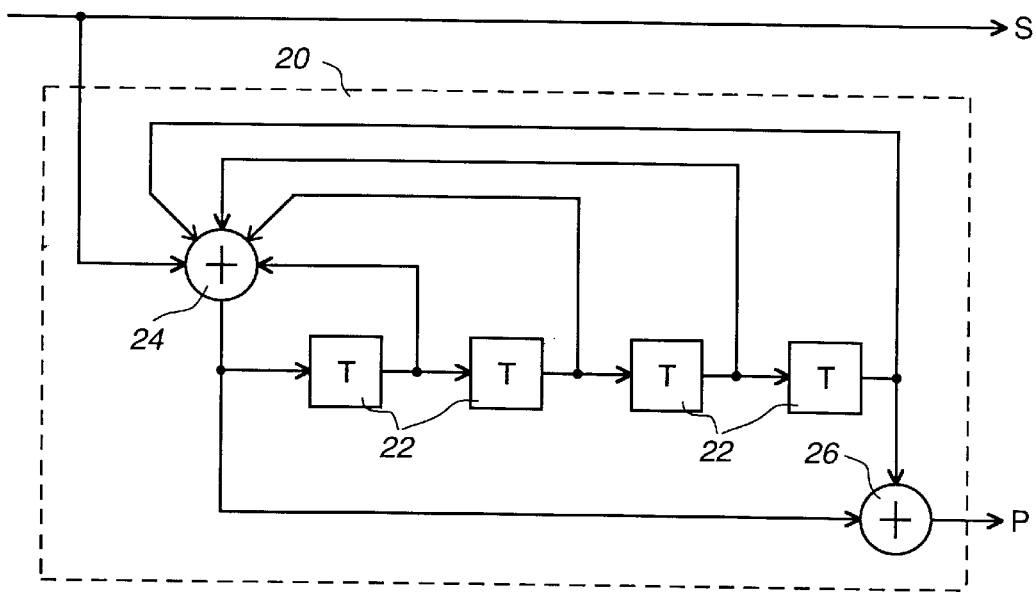
FIG. 2 illustrates a known RSC code encoder which may be used in the encoder of FIG. 1.

FIG. 2 illustrates one form that each of the RSC code encoders 10 and 12 may take. As shown in FIG. 2, each information bit supplied to each encoder is supplied directly to an output of the encoder as a systematic bit S, and is also supplied as an input to a recursive convolutional (RC) code encoder 20, shown within a dashed-line box, which produces each parity bit P of the encoder at its output. The RC encoder 20 comprises four delay elements 22 each providing a delay T of one information bit period, and two modulo-2 adders 24 and 26, connected as shown to operate in accordance with feedback and feed-forward polynomials of $(37, 21)_8$. This form of the RC code encoder 20 is given only by way of example, and each encoder may have any other desired form.

The systematic and parity bits produced by the encoders 10 and 12 are supplied to the puncturing block 16 in the encoder of FIG. 1. These bits S1, P1 and S2, P2 are selected and passed by the puncturing block 16 in accordance with respective 2-bit puncturing codes that are shown in FIG. 1 at the respective inputs of this block. Thus the non-interleaved systematic bits S1 are all selected (code 11), none of the interleaved systematic bits S2 are selected (code 00), and the parity bits P1 and P2 are selected alternately (codes 10 and 01 respectively) to produce respective output bits. Consequently, the block 16 selects four bits (two S1, one P1, and one P2) for every two information bits supplied to the input of the turbo code encoder, so that the entire turbo code encoder provides rate ½ encoding. As indicated above, the output bits of the puncturing block 16 can be supplied to a modulator, which can operate in accordance with any desired modulation scheme, for example BPSK (binary phase shift keying) or an orthogonal modulation scheme using Walsh codes.

The interleaver 14 in the turbo code encoder of FIG. 1 operates, as is known, to interleave the information bits supplied to the input of the turbo code encoder; this interleaving is effected in a predetermined manner within a block or frame of such information bits, the number of bits in each such block or frame also being predetermined. For example, all of the input information bits within one block or frame are stored consecutively in columns and rows of a matrix of storage locations, and then the bits are read consecutively from the rows and columns, respectively, of the matrix of storage locations to effect the interleaving operation. Thus if the matrix has m columns and n rows, then for each block or frame the input information bits are written in the sequence 1, 2, 3, . . . , n, n+1, n+2, . . . , 2n, 2n+1, . . . , 3n, . . . , mn and read in the sequence 1, n+1, 2n+1, . . . , (m−1)n+1, 2, n+2, . . . , (m−1)n+2, 3, . . . , mn, so that within each block or frame consecutively adjacent bits in the input information bit sequence are not adjacent one another in the interleaved bit sequence. This form of interleaving is given only by way of example, and the interleaver may have any other desired form.

Figures 3, 4:
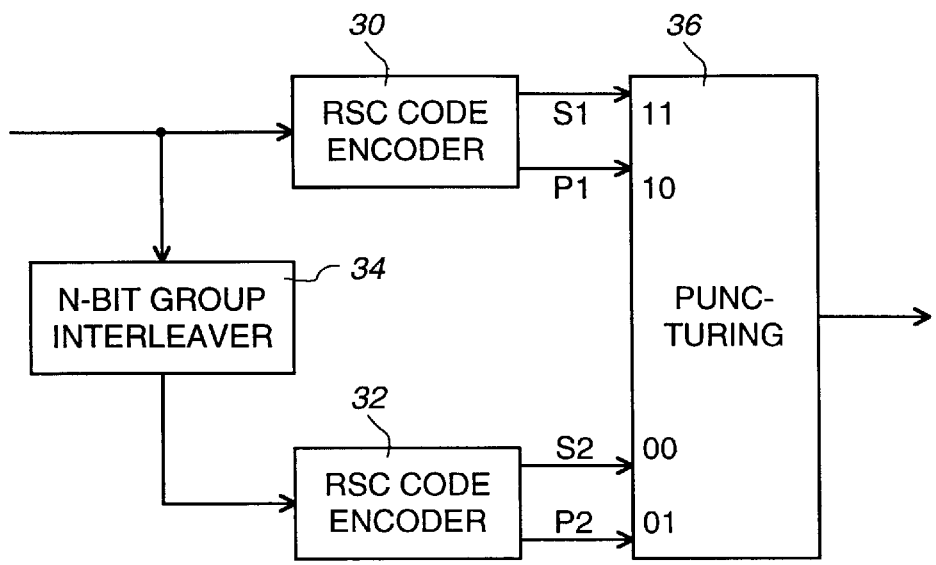
FIG. 3 illustrates a PCCC or turbo code encoder in accordance with an embodiment of this invention.
FIG. 4 is a diagram illustrating operation of an interleaver of the encoder of FIG. 3.

FIG. 3 illustrates, in a similar manner to FIG. 1, a PCCC or turbo code encoder in accordance with an embodiment of the invention. The encoder of FIG. 3 comprises two RSC code encoders 30 and 32, an interleaver 34, and a puncturing block 36 which generally correspond to, and except as described below can be the same as, the corresponding units 10, 12, 14, and 16 of the encoder of FIG. 1. More particularly, the encoders 30 and 32 can be identical to the encoders 10 and 12 of FIG. 1, and the puncturing block 36 can be identical to the puncturing block 16 of FIG. 1; accordingly, these units are not further described here.

The interleaver 34 in the turbo code encoder of FIG. 3 differs from the interleaver 14 in the known turbo code encoder of FIG. 1 in that, instead of interleaving individual bits within each block or frame of input information bits, it interleaves N-bit groups of bits, also referred to herein as symbols, where N is a positive integer greater than 1. The peration of the symbol-based interleaver 34 is described below with reference to FIG. 4 by way of example for the case of N=2.

FIG. 4 represents a matrix of storage locations as described above with reference to the operation of the interleaver, comprising m columns and n rows of storage locations each for storing a respective bit in a block or frame of mn input information bits. As described above, the input information bits are written consecutively into the columns and rows of the matrix in their order from 1 to mn, and the storage locations illustrated in FIG. 4 are numbered accordingly. However, contrary to the operation of the interleaver 14 as described above, in the interleaver 34 the information bits are kept in symbols or groups each of N consecutive bits, in this case pairs of bits with N=2, and are interleaved accordingly.

Thus the operation of the interleaver 34 in the encoder of FIG. 3 is such that the information bits in each block or frame are read out from the storage locations in a sequence which maintains the pairs of bits; with reference to FIG. 4 the bits are read in the sequence 1, 2, n+1, n+2, 2n+1, 2n+2, . . . , (m−1)n+1, (m−n)n+2, 3, 4, n+3, n+4, 2n+4, . . . , n−1, n, 2n−1, 2n, 3n−1, 3n, . . . mn−1, mn.

While the above description and FIG. 4 relate specifically to the case of N=2, in which the bits are parsed in pairs of bits which are interleaved accordingly, it can be seen that the same principles can be applied for larger values of N, the input information bits being parsed and interleaved in symbols or groups each of N consecutive bits, which remain consecutively adjacent one another. In addition, it is observed that the above description is provided as only one example of the manner in which the interleaving operation can be carried out, and that the invention is equally applicable to any manner of interleaving in which groups each of N consecutively adjacent input information bits are interleaved to maintain the adjacency of the bits within each group.

Figure 5:
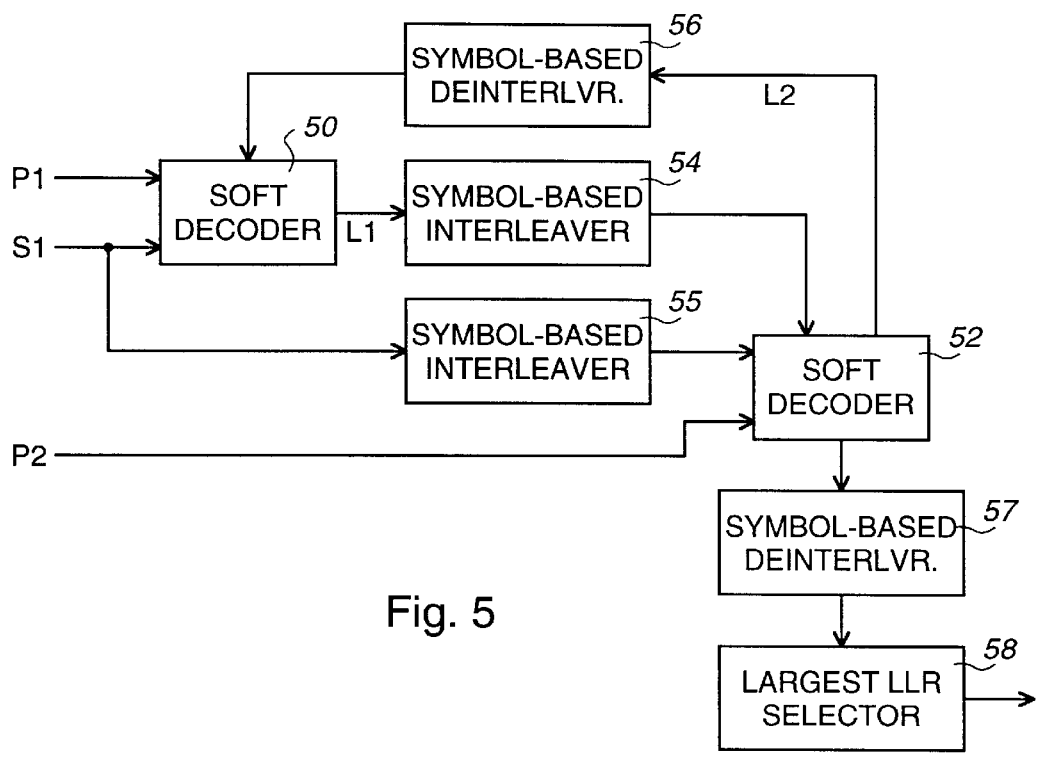
FIG. 5 illustrates a decoder complementary to the encoder of FIG. 3.

FIG. 5 illustrates a complementary decoder, which has the general form of iterative turbo code decoders known in the art, but differs from such decoders in certain respects as described below. The decoder is supplied with inputs which correspond to the bits S1, P1, and P2 described above and which accordingly are given these same references in FIG. 5; in practice these inputs to the decoder are soft demodulated versions of the respective bits as is known in the art of turbo coding and related modulation schemes.

Referring to FIG. 5, the turbo decoder comprises soft decoders 50 and 52 which are complementary to the encoders 30 and 32 respectively, symbol-based interleavers 54 and 55 which operate in the same manner (for symbols or N-bit groups of bits) as the interleaver 34 as described above, symbol-based deinterleavers 56 and 57 which operate (for symbols or N-bit groups of bits) in a manner complementary to the interleavers, and a selector unit 58 which provides an output of the turbo decoder. Received signals representing the systematic bits S1 and parity bits P1 at the input of the turbo code decoder are supplied to the soft decoder 50, which in known manner produces Logarithm of Likelihood Ratio (LLR) information L1 for each information symbol. This information is interleaved by the interleaver 54, the received signals representing the systematic bits S1 are interleaved by the interleaver 55, and the interleaved LLR and systematic information is supplied to the soft decoder 52, which is also supplied with received signals representing the (interleaved) parity bits P2. The soft decoder 52 produces LLR information L2 for each information symbol, and this is deinterleaved by the deinterleaver 56 and fed back to the soft decoder 50 for use in a next one of successive decoding iterations. After a desired number of iterations, an output of the soft decoder 52, deinterleaved by the deinterleaver 57, is supplied to the selector unit 58, which selects the largest LLR to determine the respective decoded information symbol at the output of the turbo code decoder.

As explained above, the interleavers 54 and 55 and deinterleavers 56 and 57 operate on the symbols, each corresponding to N bits of information, into which the information bits are parsed. Consequently, in the trellis diagram in accordance with which the decoders 50 and 52 operate for decoding the RSC codes provided by the encoders 30 and 32 respectively, there is a compression of N sections of the trellis, each of which has 2 branches leaving each state, into one merged trellis section with $2^N$ branches leaving each state. The number of branches leaving each state is desirably kept no greater than the number of states in the merged trellis; otherwise there are parallel transitions which degrade the performance of the code.

The turbo code decoder of FIG. 5 operates using the modified BCJR algorithm as described in the article by Berrou et al. referred to above, with the following changes for operation of the constituent soft decoders 50 and 52 on the N-bit groups of information bits. First, the LLR values are defined as:

$$\Delta(d_k = i) = \log\left(\frac{Pr\{d_k = i \mid \vec{R}\}}{Pr\{d_k = 0 \mid \vec{R}\}}\right), i = 0, 1, 2, \ldots, 2^N - 1 \quad (1)$$

where R denotes the received data streams $(\vec{x}, \vec{y}_1)$ for the decoder 50 (corresponding to the bits S1, P1 respectively) and $(\vec{x}, \vec{y}_2)$ for the decoder 52, and k indicates the time index. This definition of the LLR values allows for easy conversion between symbol (i.e. N-bit group) LLR values and symbol AP (a posteriori) probability values.

Second, the branch metrics are modified to account for a multi-dimensional signal space. For example, for an AWGN (additive white Gaussian noise) channel, the gamma values are given by:

$$Pr\{x_k \mid d_k, S_k, S_{k-1}\} = e^{\frac{-1}{N_0}(x_k - b^s(d_k, S_{k-1}, S_k))^2} \quad (2)$$

$$Pr\{y_k \mid d_k, S_k, S_{k-1}\} = e^{\frac{-1}{N_0}(y_k - b^p(d_k, S_{k-1}, S_k))^2} \quad (3)$$

where $b^{s|p}(d_k, S_{k-1}, S_k)$ is the modulator output associated with the branch from state $S_{k-1}$ to state $S_k$ at time index k if the corresponding input $d_k$ is equal to i. These equations can be generalized for any signal set by calculating these expressions for each dimension of the signal set and multiplying all the terms together.

Third, the expression for the intrinsic information is changed according to the modulation scheme that is used. A general expression for the intrinsic information, which can be simplified depending upon the modulation scheme used, is:

$$\log\left(\frac{Pr\{x_k \mid d_k = i\}}{Pr\{x_k \mid d_k = 0\}}\right) = \frac{-1}{N_0}\sum_{j=1}^{J}[(x_{k,j} - m_{i,j})^2 - (x_{k,j} - m_{0,j})^2] \quad (4)$$

where $m_{i,j}$ denotes the j-th component (j=1, 2, ... J) of the modulation symbol (of dimensionality J) for the symbol i.

It can be appreciated that the decoders 50 and 52 can alternatively operate in accordance with other algorithms; for example they may perform maximum maximal-AP (MAX-MAP) decoding or Soft-Output Viterbi Algorithm (SOVA) decoding which are also known in the art.

The turbo code encoding and decoding in accordance with an embodiment of the invention as described above can provide the advantage of reduced memory sizes for a ROM (read-only memory) used for a look-up table to constitute the interleaver and for a RAM (random access memory) for storing probability values for the decoding algorithm. More specifically, the size of the ROM can be substantially halved, and the overall RAM size can be reduced to about 65% of its original size for a conventional decoder using a convolutional code with 4 delay elements, and to about 75% of this original size using a code with 3 delay elements.

In addition, the turbo code encoding and decoding as described above can provide the advantage of a faster rate of convergence for the iterative decoding algorithm than for a conventional decoder, so that a reduced number of iterations can be used to provide a desired performance level or BER, whereby computation requirements are reduced. For example, a BER performance which typically requires 10 decoder iterations in a conventional decoder may require only 5 iterations using 2-bit groups as described above.

As described above, the turbo code encoder of FIG. 3 provides rate ½ encoding with puncturing of the parity bits by the puncturing block 36. Without such puncturing of the parity bits, i.e. if all of the systematic information bits S1 and all of the parity bits P1 and P2 are forwarded from the encoder, the encoder provides rate ⅓ encoding. Higher rates of encoding can be provided by an increase in the number of parity bits relative to the number of systematic bits. This can be facilitated using the principles of this invention.

Figure 6:
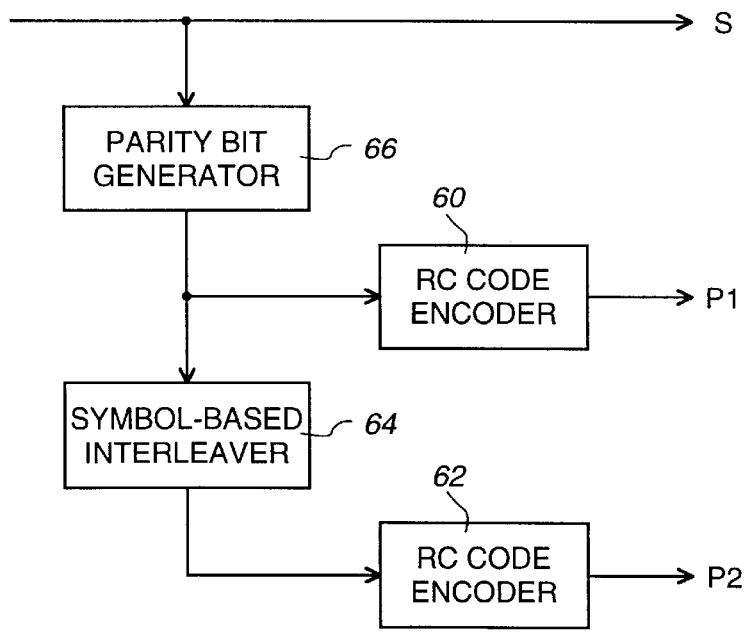
FIG. 6 illustrates a PCCC or turbo code encoder in accordance with another embodiment of this invention.

By way of example, FIG. 6 illustrates a rate ¼ turbo code encoder in which there are two constituent RC code encoders 60 and 62, producing parity bits P1 and P2 respectively, each of which can for example be the same as described above for the RC code encoder 20 in FIG. 2. The turbo code encoder of FIG. 6 also comprises a symbol-based interleaver 64 and a parity bit generator 66. In the example described below, the parity bit generator 66 generates one parity bit for every two information bits supplied to it, and N=3 so that the interleaver 64 operates to interleave 3-bit groups or symbols in each block or frame.

In the turbo code encoder of FIG. 6, information bits supplied to the encoder are supplied directly to an output of the decoder as systematic bits S. For every two sequential input information bits, the parity bit generator 66 generates one parity bit in known manner, and supplies the resulting three bits to the encoder 60 and to the interleaver 64. The interleaver interleaves, in each predetermined-size block or frame of information, the three-bit groups or symbols supplied to it, and supplies the interleaved symbols to the encoder 62. Consequently, for every 2 information bits supplied to the turbo code encoder of FIG. 6, the encoder produces 2 systematic bits, 3 parity bits P1, and 3 parity bits P2, for a total of 8 bits to provide rate ¼ encoding. A complementary turbo code decoder can be similar to that described above with reference to FIG. 5, for the value of N=3 and modified to accommodate the additional parity bits generated by the parity bit generator 66.

It can be appreciated that the turbo code encoder of FIG. 6 can be modified in various ways to provide different encoding rates. For example, the encoder 62 could be supplied with only the information bits and not the additional parity bits generated by the parity bit generator 66, thereby producing a rate 2/7 turbo code encoder. Alternatively, the parity bit generator 66 could generate a parity bit for each information bit (e.g. the complement of the information bit), with the interleaver 64 interleaving groups each of N=2 bits and the encoders 60 and 62 each producing 2 parity bits for each information bit supplied to the input of the turbo code encoder, which thereby provides rate ⅕ encoding.

Although particular encoding rates, values of N, and types of convolutional encoders are described above, the invention is not limited in these respects, and these and other elements of the embodiments of the invention described above may be changed without departing from the scope of the invention as defined in the claims. In addition, although the above description relates to turbo code encoders with two parallel encoder paths and one interleaver, the principles of the invention may also be applied to encoders with more than two parallel encoder paths and a plurality of interleavers any one or more of which may operate to interleave N-bit groups of bits with N>1. Furthermore, although the functions of the turbo code encoder and decoder are represented as separate units, it can be appreciated that these can be implemented by functions of one or more digital signal processors (DSPs) and/or application specific integrated circuits (ASICs).

Thus although specific embodiments of the invention have been described above, it can be appreciated that numerous modifications, variations, adaptations and combinations of the aspects thereof may be made within the scope of the invention as defined in the claims.

What is claimed is:

1. A parallel concatenated convolutional code (PCCC) encoder comprising a first convolutional code encoder to which information bits are supplied for producing first parity bits, an interleaver, and a second convolution code encoder to which said information bits are supplied via the interleaver for producing second parity bits, wherein the interleaver interleaves the information bits in groups each of N bits, where N is an integer greater than one.

2. An encoder as claimed in claim 1 wherein N=2.

3. An encoder as claimed in claim 1 wherein N=3.

4. An encoder as claimed in claim 1 and including a parity bit generator supplied with the information bits for generating additional parity bits, wherein the additional parity bits are supplied with the information bits to at least one of the first convolutional code encoder and the interleaver.

5. A parallel concatenated convolutional code (PCCC) encoder comprising:
   a parity bit generator responsive to information bits supplied to an input of the encoder for generating parity bits;
   an interleaver responsive to the information bits and the parity bits for interleaving the information and parity bits in groups each of N bits, where N is an integer greater than one;
   a first convolutional code encoder responsive to at least the information bits for producing first output parity bits;
   a second convolutional code encoder responsive to interleaved information and parity bits produced by the interleaver, to produce second output parity bits; and
   means for deriving an output of the PCCC encoder from the information bits and at least some of the first and second output parity bits.

6. An encoder as claimed in claim 5 wherein the first convolutional code encoder is also responsive to the parity bits produced by the parity bit generator.

7. An encoder as claimed in claim 6 wherein the parity bit generator generates one of said parity bits for every two information bits.

8. An encoder as claimed in claim 7 wherein N=3.

9. An encoder as claimed in claim 5 wherein N=2.

10. A method of encoding comprising the steps of supplying information bits directly as systematic bits to a first convolutional code encoder to produce first parity bits, supplying said information bits via an interleaver to a second convolutional code encoder to produce second parity bits, and supplying said information bits and said first and second parity bits to encoder outputs, wherein the interleaver interleaves the information bits in groups each of N bits, where N is an integer greater than one.

11. A method as claimed in claim 10 wherein N=2.

12. A method as claimed in claim 10 wherein N=3.

13. A method as claimed in claim 10 and including the step of generating additional parity bits from the information bits, wherein the additional parity bits are supplied with the information bits to at least one of the first convolutional code encoder and the interleaver.

14. A method as claimed in claim 13 wherein one of said additional parity bits is generated for every two information bits.

15. A method as claimed in claim 14 wherein N=3.

16. A method as claimed in claim 13 wherein the additional parity bits are supplied with the information bits to the first convolutional code encoder and via the interleaver to the second convolutional code encoder.

17. A method as claimed in claim 16 wherein one of said additional parity bits is generated for every two information bits.

18. A method as claimed in claim 17 wherein N=3.

19. A method of decoding information encoded by the method of claim 10, comprising iteratively decoding in first and second decoders information representing the systematic bits using information representing the first and second parity bits respectively and iteratively decoding information coupled from the first decoder to the second decoder via an interleaver and from the second decoder to the first decoder via a deinterleaver complementary to the interleaver, wherein the interleaver interleaves the information in groups each representing N bits, where N is an integer greater than one.

20. A parallel concatenated convolutional code (PCCC) decoder comprising two constituent decoders coupled together via at least one interleaver and at least one deinterleaver complementary to the interleaver for iteratively decoding systematic and parity information produced by a PCCC encoder, wherein the interleaver and deinterleaver operate to interleave and deinterleave information in groups each representing N bits, where N is an integer greater than one.

* * * * *